United States Patent
Hsieh et al.

(10) Patent No.: US 10,937,723 B2
(45) Date of Patent: Mar. 2, 2021

(54) PACKAGE CARRIER STRUCTURE HAVING INTEGRATED CIRCUIT DESIGN AND MANUFACTURING METHOD THEREOF

(71) Applicant: Unimicron Technology Corp., Taoyuan (TW)

(72) Inventors: Yu-Chung Hsieh, Taoyuan (TW); Chun-Hsien Chien, New Taipei (TW); Yu-Hua Chen, Hsinchu (TW)

(73) Assignee: UNIMICRON TECHNOLOGY CORP., Taoyuan (TW)

( * ) Notice: Subject to any disclaimer, the term of this patent is extended or adjusted under 35 U.S.C. 154(b) by 395 days.

(21) Appl. No.: 16/028,440

(22) Filed: Jul. 6, 2018

(65) Prior Publication Data
US 2019/0348356 A1 Nov. 14, 2019

(30) Foreign Application Priority Data
May 14, 2018 (TW) .................. 107116326

(51) Int. Cl.
*H01L 23/498* (2006.01)
*H01L 49/02* (2006.01)
(Continued)

(52) U.S. Cl.
CPC ... *H01L 23/49838* (2013.01); *H01F 27/2804* (2013.01); *H01F 27/40* (2013.01);
(Continued)

(58) Field of Classification Search
CPC . H01L 23/49838; H01L 23/498; H01L 23/00; H01L 23/49822; H01L 23/49816;
(Continued)

(56) References Cited

U.S. PATENT DOCUMENTS 5,822,851 A * 10/1998 Yamasaki ............. H01L 21/485
29/846
6,396,153 B2 * 5/2002 Fillion ................ H01L 21/4853
257/773
(Continued)

FOREIGN PATENT DOCUMENTS

CN 106558565 A 4/2017
CN 107973267 A 5/2018
(Continued)

*Primary Examiner* — Thienvu V Tran
*Assistant Examiner* — Nusrat Quddus
(74) *Attorney, Agent, or Firm* — CKC & Partners Co., LLC

(57) ABSTRACT

A package carrier structure includes an insulating substrate, a first wiring layer, a second wiring layer, at least one conductive via, a plurality of first and second conductive pads, a first insulating layer, a plurality of first and second conductive structures, and an encapsulated layer. The first and second wiring layers are disposed on the upper and lower surfaces of the insulating substrate respectively. The conductive via penetrates through the insulating substrate and electrically connected to the first and second wiring layers. The first and second conductive pads are disposed on the upper surface and electrically connected to the first wiring layer. The first insulating layer is disposed on the upper surface and exposing the first and second conductive pads. The first and second conductive structures are disposed on the first and second conductive pads respectively. The lower surface of the insulating substrate is covered by the encapsulation layer.

18 Claims, 10 Drawing Sheets

(51) Int. Cl.
    *H01L 21/683*     (2006.01)
    *H01L 21/48*     (2006.01)
    *H01L 23/00*     (2006.01)
    *H01F 27/28*     (2006.01)
    *H01F 27/40*     (2006.01)
    *H01L 25/16*     (2006.01)

(52) U.S. Cl.
    CPC ........ *H01L 21/481* (2013.01); *H01L 21/4846* (2013.01); *H01L 21/6836* (2013.01); *H01L 23/49816* (2013.01); *H01L 23/49822* (2013.01); *H01L 23/562* (2013.01); *H01L 25/16* (2013.01); *H01L 28/10* (2013.01); *H01L 28/60* (2013.01); *H01F 2027/2809* (2013.01); *H01L 2221/68327* (2013.01)

(58) Field of Classification Search
    CPC ................. H01L 23/562; H01L 23/552; H01L 23/49827; H01L 23/3128; H01L 23/5226; H01L 49/02; H01L 21/683; H01L 21/48; H01L 21/6836; H01L 21/481; H01L 21/4846; H01L 21/52; H01L 21/56; H01L 21/486; H01L 21/4885; H01L 21/4857; H01L 28/10; H01L 28/60; H01L 25/16; H01L 2221/68327; H01L 2224/09505; H01L 2224/08225; H01L 2224/32225; H01L 2224/73201; H01L 2224/9211; H01L 2224/97; H01L 2224/16225; H01L 2224/32145; H01L 2924/18161; H01F 27/28; H01F 27/40; H01F 27/16; H01F 27/2804; H01F 2027/2809
    USPC ......................................................... 361/270

See application file for complete search history.

(56) References Cited

U.S. PATENT DOCUMENTS

| | | | |
|---|---|---|---|
| 6,830,958 | B2 | 12/2004 | Makimoto |
| 8,486,803 | B2 | 7/2013 | Huang et al. |
| 8,912,670 | B2 * | 12/2014 | Teh .................. H01L 21/56 257/796 |
| 9,159,708 | B2 * | 10/2015 | Haba ................. H01L 25/16 |
| 10,163,773 | B1 * | 12/2018 | Kapusta ............. H01L 24/92 |
| 2007/0155049 | A1 | 7/2007 | Tsai |
| 2007/0231962 | A1 * | 10/2007 | Fujii ................. H05K 1/16 438/107 |
| 2014/0117539 | A1 * | 5/2014 | Karasawa ........ H01L 23/49822 257/737 |
| 2014/0140400 | A1 * | 5/2014 | George ............. H04N 19/13 375/240.12 |
| 2014/0146504 | A1 * | 5/2014 | Hu .................... H05K 3/007 361/767 |
| 2014/0332983 | A1 * | 11/2014 | Ho .................... H01L 23/3121 257/777 |
| 2015/0084206 | A1 * | 3/2015 | Lin .................... H01L 23/5389 257/774 |
| 2015/0200337 | A1 * | 7/2015 | Denda ................. H01L 33/60 257/99 |
| 2017/0154834 | A1 * | 6/2017 | Tonedachi ........ H01L 23/49844 |
| 2017/0309700 | A1 * | 10/2017 | Duevel ............. H01F 17/0006 |
| 2018/0108615 | A1 * | 4/2018 | Hsu ................... H01L 25/0657 |
| 2019/0043810 | A1 * | 2/2019 | Kapusta ............ H01L 21/4857 |

FOREIGN PATENT DOCUMENTS

| | | |
|---|---|---|
| TW | 200931458 A | 7/2009 |
| TW | M477045 U | 4/2014 |
| TW | 201444426 A | 11/2014 |
| TW | 201717376 A | 5/2017 |

* cited by examiner

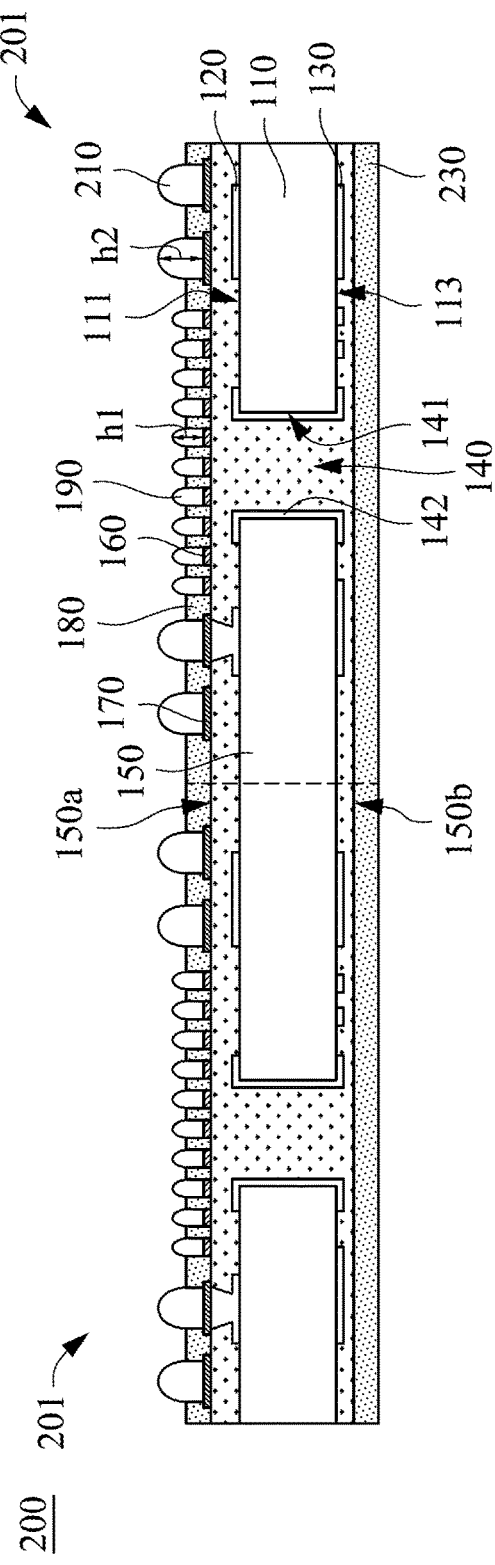
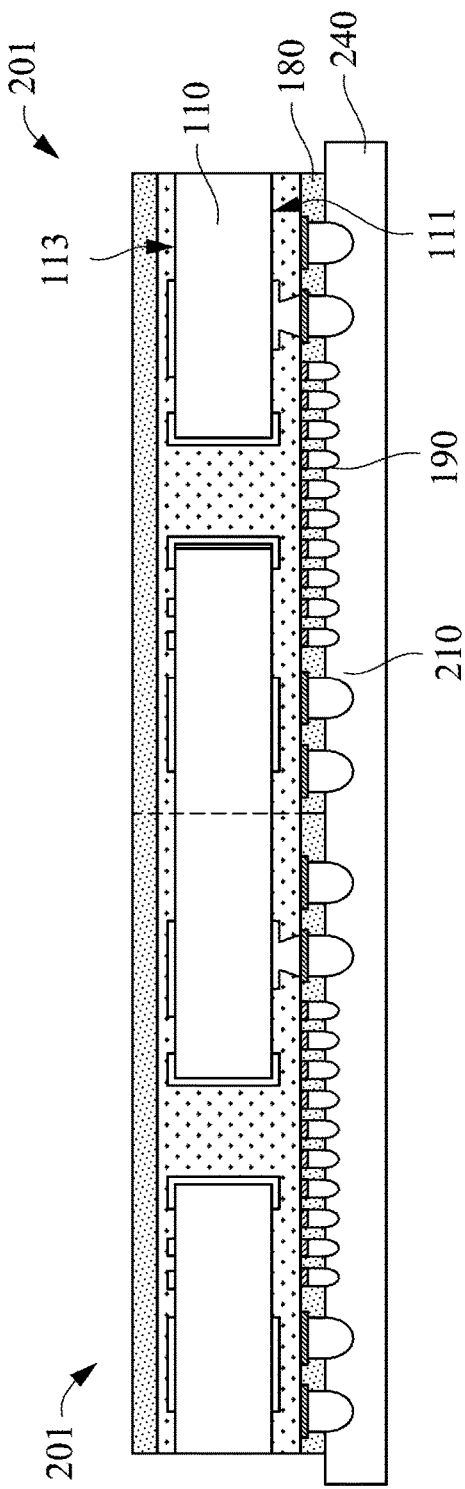
Fig. 2A
Fig. 2B

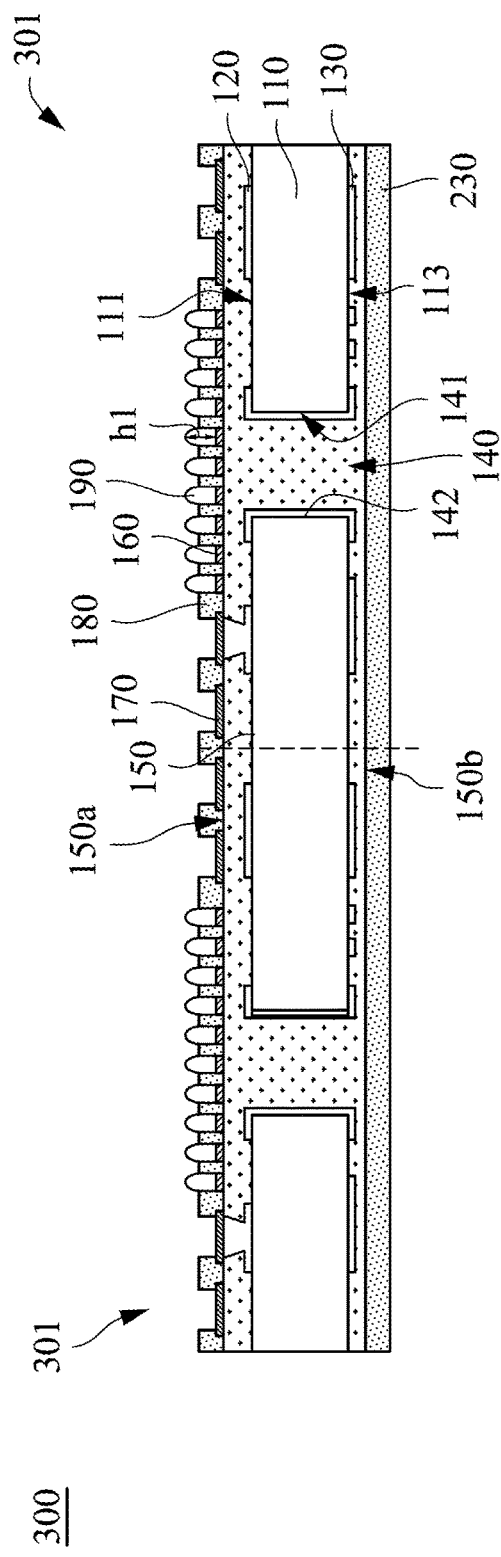
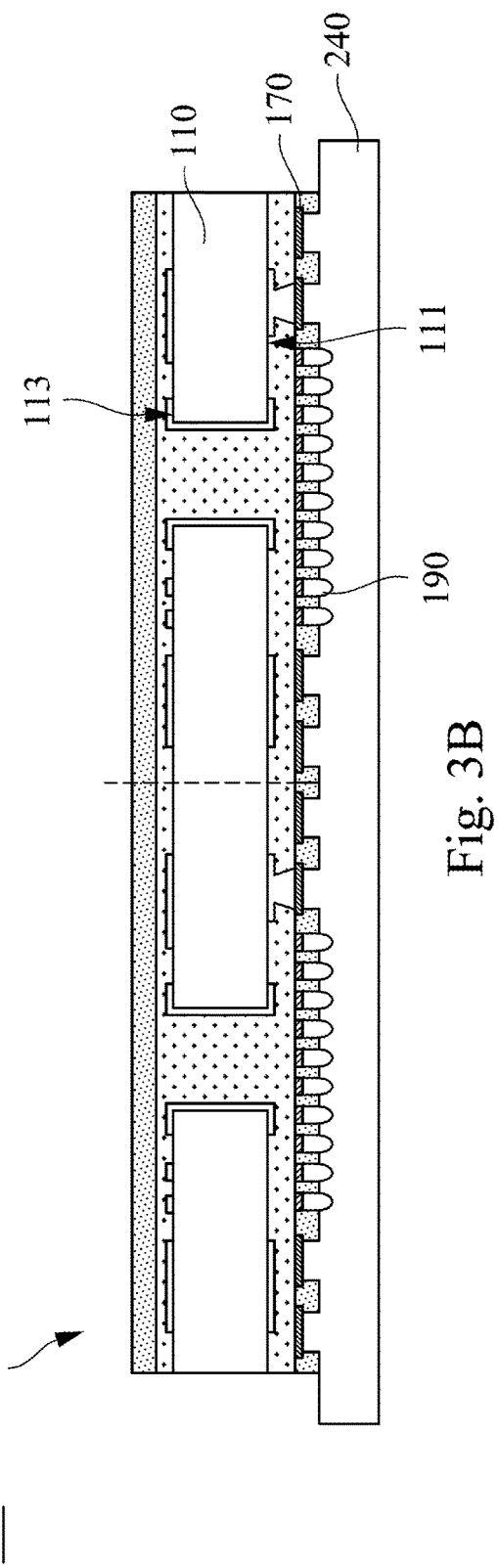
Fig. 3A
Fig. 3B

PACKAGE CARRIER STRUCTURE HAVING INTEGRATED CIRCUIT DESIGN AND MANUFACTURING METHOD THEREOF

CROSS-REFERENCE TO RELATED APPLICATION

This application claims priority to Taiwan Application Serial Number 107116326, filed May 14, 2018, which is herein incorporated by reference.

BACKGROUND

Field of Invention

The present invention relates to a package carrier substrate and manufacturing method thereof.

Description of Related Art

Along with an increasing demand for lightweight and sophisticated electronic devices, there is a need for a high chip packaging efficiency, together with a small and lightweight chip package. In the conventional chip packaging process, a chip substrate is cut into multiple chip structures that include conductive structures disposed thereon. The chip structures are then disposed on a package substrate, where the conductive structures are opposite to the package substrate. Next, the chip structures and the package substrate are sealed together by an encapsulation layer. The conductive structures are exposed subsequently through an etching process. Then, the encapsulation layer and the package substrate between adjacent ones of chip structures are cut to form multiple chip package structures. However, there are some disadvantages in the conventional chip packaging process. For example, the conventional chip packaging process is complicated, together with long processing time, high cost and yet poor yield.

Therefore, there is an urgent call for a package carrier substrate, a chip package structure and a manufacturing method thereof that meet the goals of a small, lightweight, and integrated circuit design in chip package structure, as well as a less complicated process, shorter processing time, lower cost and high yield over the conventional chip packaging process.

SUMMARY

The present invention provides a package carrier substrate, a chip package structure, and a manufacturing method thereof for addressing the aforementioned issues.

One aspect of the present invention is to provide a package carrier substrate. The package carrier substrate includes an insulating substrate, a first wiring layer, a second wiring layer, at least one conductive via, a plurality of first conductive pads, a plurality of second conductive pads, a first insulating layer, a plurality of first conductive structures, a plurality of second conductive structures, and an encapsulation layer. The insulating substrate has an upper surface and a lower surface, in which the lower surface is opposite to the upper surface. The first wiring layer and the second wiring layer are disposed on the upper surface and the lower surface of the insulating substrate respectively. The conductive via penetrates through the insulating substrate and electrically connected to the first wiring layer and the second wiring layer. The first conductive pads and the second conductive pads are disposed on the upper surface of the insulating substrate and electrically connected to the first wiring layer. The first insulating layer is disposed on the upper surface of the insulating substrate, while the first conductive pads and the second conductive pads are exposed from the first insulating layer. Each of the first conductive structures is disposed on the first conductive pads and has a first height. Each of the second conductive structures is disposed on the second conductive pads and has a second height that is greater than the first height. The lower surface and a sidewall of the insulating substrate are covered by the encapsulation layer.

According to one embodiment of the present invention, the package carrier substrate further includes a dielectric layer covering the upper surface, the lower surface, the first wiring layer, and the second wiring layer.

According to one embodiment of the present invention, the dielectric layer includes a plurality of conductive blind holes disposed on the first wiring layer and electrically connected to the second conductive structures.

According to one embodiment of the present invention, the package carrier substrate further includes a second insulating layer covering the lower surface of the insulating substrate. The second insulating layer is interposed between the insulating substrate and the encapsulation layer.

According to one embodiment of the present invention, the first conductive structures and the second conductive structures are solder ball or conductive pillar.

According to one embodiment of the present invention, the first conductive pads are surrounded by the second conductive pads.

According to one embodiment of the present invention, the first height is 300 um to 600 um, and the second height is 60 um to 150 um.

According to one embodiment of the present invention, the at least one conductive via may include a plurality of conductive vias. The conductive vias, a portion of the first wiring layer, and a portion of the second wiring layer together form an inductor.

According to one embodiment of the present invention, the package carrier substrate further includes a capacitor disposed on the upper surface of the insulating substrate. The capacitor is electrically connected to the first wiring layer.

Another aspect of the present invention is to provide a manufacturing method of the package carrier substrate. The manufacturing method includes the following steps. First, providing a package substrate having a plurality of substrate units. Each of the substrate units includes an insulating substrate, a first wiring layer, a second wiring layer, at least one conductive via, a plurality of first conductive pads, a plurality of second conductive pads, a first insulating layer, a plurality of first conductive structures, and a plurality of second conductive structures. The insulating substrate has an upper surface and a lower surface, in which the lower surface is opposite to the upper surface. The first wiring layer and the second wiring layer are disposed on the upper surface and the lower surface of the insulating substrate respectively. The conductive via penetrates through the insulating substrate and electrically connected to the first wiring layer and the second wiring layer. The first conductive pads and the second conductive pads are disposed on the upper surface of the insulating substrate and electrically connected to the first wiring layer. The first insulating layer is disposed on the upper surface of the insulating substrate. The first conductive pads and the second conductive pads are exposed form the first insulating layer. Each of the first conductive structures is disposed on the first conductive pads and has a first height. Each of the second conductive structures is disposed on the second conductive pads and has a second height that is greater than the first height. Next, attaching the package substrate onto an adhesive tape, in which the first conductive structures and the second conductive structures are completely covered by the adhesive tape. Cutting the package substrate attached to the adhesive tape so as to form a first gap between adjacent ones of the substrate units. Then, forming an encapsulation layer covering each of the substrate units and filling the first gap. Cutting the encapsulation layer in the first gap to form a plurality of package carrier substrates on the adhesive tape, such that a second gap is formed between adjacent ones of the package carrier substrates. Removing the adhesive tape.

According to one embodiment of the present invention, each of the first gaps has a width ranged from 300 um to 1000 um.

According to one embodiment of the present invention, each of the second gaps has a width ranged from 100 um to 300 um.

According to one embodiment of the present invention, each of the package carrier substrates further includes a second insulating layer covering the lower surface of the insulating substrate. The second insulating layer is interposed between the insulating substrate and the encapsulation layer.

One aspect of the present invention is to provide a manufacturing method of package carrier substrate. The manufacturing method includes the following steps. First, providing a package substrate having a plurality of substrate units. Each of the substrate units includes an insulating substrate, a first wiring layer, a second wiring layer, at least one conductive via, a plurality of first conductive pads, a plurality of second conductive pads, a first insulating layer, a plurality of first conductive structures, and a plurality of second conductive structures. The insulating substrate has an upper surface and a lower surface, in which the lower surface is opposite to the upper surface. The first wiring layer and the second wiring layer are disposed on the upper surface and the lower surface of the insulating substrate respectively. The conductive via penetrates through the insulating substrate and electrically connected to the first wiring layer and the second wiring layer. The first conductive pads and the second conductive pads are disposed on the upper surface of the insulating substrate and electrically connected to the first wiring layer. The first insulating layer is disposed on the upper surface of the insulating substrate, and the first conductive pads and the second conductive pads are exposed from the first insulating layer. Each of the first conductive structures is disposed on the first conductive pads and has a first height. Next, attaching the package substrate onto an adhesive tape, in which the first conductive structures are completely covered by the adhesive tape. Cutting the package substrate attached to the adhesive tape so as to form a first gap between adjacent ones of the substrate units. Forming an encapsulation layer covering each of the substrate units and filling the first gap. Cutting the encapsulation layer inside the first gap to form a second gap. Then, removing the adhesive tape. After the adhesive tape is removed, forming a plurality of second conductive structures on the second conductive pads to form a plurality of package carrier substrates, in which each of the second conductive structures has a second height that is greater than the first height.

According to one embodiment of the present invention, each of the first gaps has a width ranged from 300 um to 1000 um.

According to one embodiment of the present invention, each of the second gaps has a width ranged from 100 um to 300 um.

According to one embodiment of the present invention, each of the package carrier substrates further includes a second insulating layer covering the lower surface of the insulating substrate. The second insulating layer is interposed between the insulating substrate and the encapsulation layer.

BRIEF DESCRIPTION OF THE DRAWINGS

The present invention can be more fully understood by reading the following detailed description of the embodiments with reference made to the accompanying drawings as follows:

FIG. 2A to FIG. 2E illustrate schematic sectional views of a package carrier substrate during various manufacturing stages according to one embodiment of the present invention.

FIG. 3A to FIG. 3F illustrate schematic sectional views of a package carrier substrate during various manufacturing stages according to another embodiment of the present invention.

DETAILED DESCRIPTION

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact.

The following embodiments are disclosed with accompanying diagrams for detailed description. For illustration clarity, many details of practice are explained in the following descriptions. However, it should be understood that these details of practice do not intend to limit the present invention. That is, these details of practice are not necessary in parts of embodiments of the present invention. Furthermore, for simplifying the drawings, some of the conventional structures and elements are shown with schematic illustrations.

Figure 1:
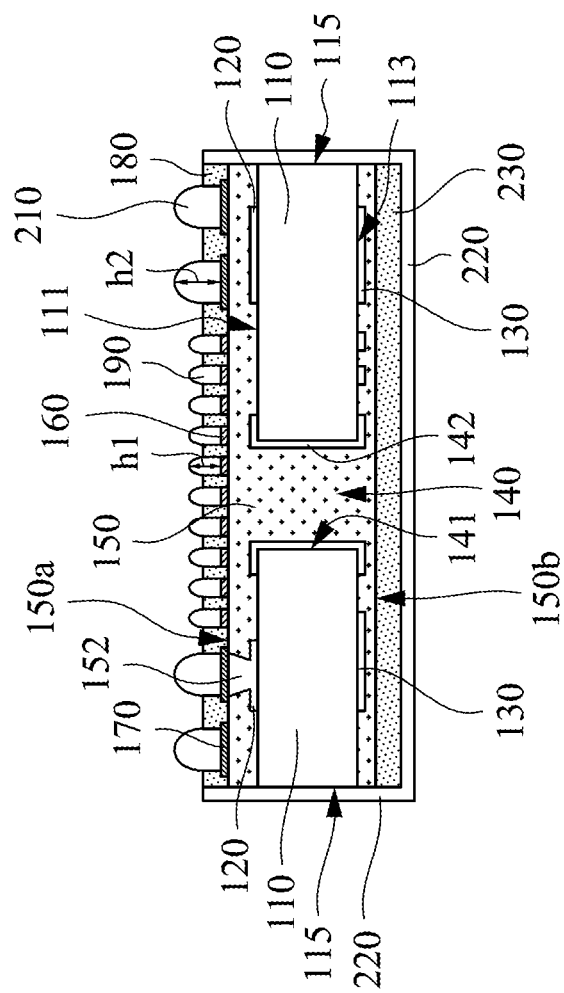
FIG. 1 illustrates a schematic sectional view of a package carrier substrate according to one embodiment of the present invention.

One aspect of the present invention is to provide a package carrier substrate. FIG. 1 illustrates a schematic sectional view of a package carrier substrate 10 according to one embodiment of the present invention. As shown in FIG. 1, the package carrier substrate 10 includes an insulating substrate 110, a first wiring layer 120, a second wiring layer 130, at least one conductive via 140, a plurality of first conductive pads 160, a plurality of second conductive pads 170, a first insulating layer 180, a plurality of first conductive structures 190, a plurality of second conductive structures 210, and an encapsulation layer 220. The insulating substrate 110 has an upper surface 111 and a lower surface 113. The lower surface 113 is opposite to the upper surface 111. For example, the insulating substrate 110 is a rigid insulating substrate, such as a glass substrate, a ceramic substrate, a sapphire substrate, or a quartz substrate, but not limited thereto. The insulating substrate 110 may be flipped onto a chip in a subsequent process to provide enhanced protection to the chip.

Referring to FIG. 1. First, a through-hole is formed in the insulating substrate 110 and penetrates from the upper surface 111 to the lower surface 113. In some embodiments, the through-hole may be formed by laser drilling, chemical drilling, and mechanical drilling from the upper surface 111 to the lower surface 113, but not limited thereto. Next, a conductive material is filled into the through-hole to form the conductive via 140. Specifically, an inner wall 141 of the conductive via 140 has an electrical connection layer 142 disposed thereon. The electrical connection layer 142 extends along the inner wall 141 and electrically connected to the first wiring layer 120 and the second wiring layer 130. In another example, the through-hole may be completely filled with the electrical connection layer 142. The electrical connection layer 142 may be made of copper or other conductive materials, such as silver, nickel, tin, or aluminium, but not limited thereto.

The first wiring layer 120 and the second wiring layer 130 are disposed on the upper surface 111 and the lower surface 113 of the insulating substrate 110 respectively. In various examples, the first wiring layer 120 and the second wiring layer 130 may be made of copper or other conductive materials, such as silver, nickel, tin, or aluminium, but not limited thereto. The first wiring layer 120 is formed according to various embodiments of the present invention. First, a conductive material layer is formed on the upper surface of the insulating substrate 110. The conductive material layer is silver, nickel, tin, or aluminium, for example. Next, a photoresist layer such as a dry photoresist layer (not shown) is formed on the conductive material layer. A portion of the conductive material layer is exposed after patterning the photoresist layer through a photolithography process. Using the patterned photoresist layer as a mask, the conductive material layer is etched and patterned. Then, the photoresist layer is removed to form the first wiring layer 120. In other embodiments, a seed layer (not shown) may be formed on the insulating substrate 110 before forming the first wiring layer 120. The seed layer may be a single-layer structure or a multi-layer structure consisting of sublayers made of different materials, such as a metal layer including a titanium layer and a copper layer on the titanium layer, or a palladium-plated copper layer, etc., but not limited thereto. The seed layer may be formed by a physical process such as titanium copper sputtering, or a chemical process such as palladium plating on a copper layer, but not limited thereto. In addition, the second wiring layer 130 may be formed by the same forming process with that of the first wiring layer 120. The conductive via 140 may be separately fabricated from the first wiring layer 120 and the second wiring layer 130. In another example, the conductive via 140 may be simultaneously fabricated with the first wiring layer 120 and the second wiring layer 130.

Still referring to FIG. 1, a dielectric layer 150 may be optionally formed. The upper surface 111, the lower surface 113, the first wiring layer 120, and the second wiring layer 130 are covered by the dielectric layer 150, and the conductive via 140 is filled with the dielectric layer 150. As shown in FIG. 1, the dielectric layer 150 has a top surface 150a and a bottom surface 150b. The bottom surface 150b is opposite to the top surface 150a. The top surface 150a is located on the upper surface 111 correspondingly, while the bottom surface 150b is located on the lower surface 113 correspondingly. In various examples, the dielectric layer 150 may be made of organic material, resin, prepreg, glass fiber, ABF thin film (Ajinomoto Build-up Film), photoimageable dielectric (PID), or the like. For example, the resin may be a phenolic resin, an epoxy resin, a polyimide resin, or polytetrafluoroethylene. In some embodiments, the dielectric layer 150 may be formed by a lamination process, a coating process, a spin-coating process, or other suitable processes. In another example of the present invention, a multilayer dielectric layer and a wiring layer interposed in the multilayer dielectric layer are fabricated.

Still referring to FIG. 1, a plurality of first conductive pads 160 and a plurality of second conductive pads 170 are disposed. The first conductive pads 160 and the second conductive pads 170 may be disposed on the upper surface 111 of the insulating substrate 110 and electrically connected to the first wiring layer 120. In another example, the first conductive pads 160 and the second conductive pads 170 are disposed in the same wiring layer with the first wiring layer 120. Alternatively, the first conductive pads 160 and the second conductive pads 170 are portions of the first wiring layer 120. In other examples, the first conductive pads 160 and the second conductive pads 170 may be made of copper or other conductive materials, such as silver, nickel, tin, or aluminium, but not limited thereto. In some embodiments, in a top view, the first conductive pads 160 are surrounded by the second conductive pads 170, and the first conductive pads 160 and the second conductive pads 170 may be configured in a matrix shape, a concentric shape, or combinations thereof. In some embodiments, the first conductive pads 160 and the second conductive pads 170 may be formed by the same forming process with that of the first wiring layer 120. A redistribution line structure may be fabricated by using the above-mentioned structure. In addition, in the embodiment where the dielectric layer 150 is included in the package carrier substrate 10, the first conductive pads 160 and the second conductive pads 170 may be disposed on the top surface 150a of the dielectric layer 150 and electrically connected to the first wiring layer 120.

As shown in FIG. 1, the first insulating layer 180 is disposed on the upper surface 111 of the insulating substrate 110, and the first conductive pads 160 and the second conductive pads 170 are exposed from the first insulating layer 180. Moreover, in the embodiment where the dielectric layer 150 is included in the package carrier substrate 10, the first insulating layer 180 is disposed on the top surface 150a of the dielectric layer 150, and the first conductive pads 160 and the second conductive pads 170 are exposed from the first insulating layer 180. In various examples, the first insulating layer 180 may be made of a solder resist material or resin material, such as epoxy resin. Alternatively, the first insulating layer 180 may be made of the same material with the dielectric layer 150. In some embodiments, the first insulating layer 180 may be formed by a lamination process, a printing process, or a coating process.

Still referring to FIG. 1, the first conductive structures 190 are disposed on the corresponding first conductive pads 160. Each of the first conductive structures 190 has a first height h1. The second conductive structures 210 are disposed on the corresponding second conductive pads 170. Each of the second conductive structures 210 has a second height h2 that is greater than the first height h1. In some embodiments, the first height h1 is 300 um to 600 um, such as 310 um, 330 um, 350 um, 370 um, 390 um, 410 um, 430 um, 450 um, 470 um, 490 um, 510 um, 530 um, 550 um, 570 um, or 590 um. In some embodiments, the second height h2 is 60 um to 150 um, such as 65 um, 70 um, 75 um, 80 um, 85 um, 90 um, 95 um, 100 um, 110 um, 120 um, 130 um, or 140 um. In some embodiments, the first conductive structures 190 and the second conductive structures 210 may be solder ball or conductive pillar, such as a tin ball, a conductive copper pillar, or a composite structure thereof. In various examples, the first conductive structures 190 and the second conductive structures 210 may be made of tin, copper, or other conductive materials, such as silver, nickel, gold, aluminium, or alloy thereof. Furthermore, in various embodiments, the dielectric layer 150 includes a plurality of conductive blind holes 152. The conductive blind holes 152 are disposed on the first wiring layer 120 and electrically connected to the second conductive structures 210. In one example, the conductive blind holes 152 may be made of the same material or a different material with the first wiring layer 120 or the second wiring layer 130, such as copper, silver, nickel, tin, or aluminium, but not limited thereto.

As shown in FIG. 1, the lower surface 113 of the insulating substrate 110 and a sidewall 115 are covered by the encapsulation layer 220. In some embodiments, the package carrier substrate 10 may optionally include a second insulating layer 230 covering the lower surface 113 of the insulating substrate 110 and/or the bottom surface 150b of the dielectric layer 150. The second insulating layer 230 may prevent or alleviate warping of the package carrier substrate 10. In one embodiment where the second insulating layer 230 is included, the second insulating layer 230 and the sidewall 115 of the insulating substrate 110 are covered by the encapsulation layer 220. Specifically, the second insulating layer 230 may be disposed between the insulating substrate 110 and the encapsulation layer 220, or the second insulating layer 230 may be disposed between the dielectric layer 150 and the encapsulation layer 220. In some embodiments, the second insulating layer 230 may be formed by the same forming process with the first insulating layer 180. In an embodiment where the second insulating layer 230 is not included, the lower surface of the insulating substrate 110 or the bottom surface 150b of the dielectric layer 150, and the sidewall 115 of the insulating substrate 110 are directly covered by the encapsulation layer 220. In detail, only the first insulating layer 180, the first conductive structures 190, and the second conductive structures 210 are exposed from the encapsulation layer 220.

Another aspect of the present invention is to provide a manufacturing method of package carrier substrate. Various manufacturing methods of the package carrier substrate 10 in the present invention are described below. For clarity, the same reference numbers used in the following embodiments refer to the same or like parts, and the description may emphasize on the differences among the embodiments without repeating the similar parts. FIG. 2A to FIG. 2E illustrates schematic sectional views of a package carrier substrate 10 during various manufacturing stages according to one embodiment of the present invention.

Reference is made to FIG. 2A. First, a package substrate 200 having a plurality of substrate units 201 is provided. Specifically, each of the substrate units 201 includes an insulating substrate 110, a first wiring layer 120, a second wiring layer 130, at least one conductive via 140, a plurality of first conductive pads 160, a plurality of second conductive pads 170, a first insulating layer 180, a plurality of first conductive structures 190, and a plurality of second conductive structures 210. In detail, the insulating substrate 110 has an upper surface 111 and a lower surface 113. The lower surface 113 is opposite to the upper surface 111. The first wiring layer 120 and the second wiring layer 130 are disposed on the upper surface 111 and the lower surface 113 of the insulating substrate 110 respectively. The conductive via 140 penetrates from the upper surface 111 to the lower surface 113 and electrically connected to the first wiring layer 120 and the second wiring layer 130. The first conductive pads 160 and the second conductive pads 170 are disposed on the upper surface 111 of the insulating substrate 110 and electrically connected to the first wiring layer 120. The first insulating layer 180 is disposed on the upper surface 111 of the insulating substrate 110, and the first conductive pads 160 and the second conductive pads 170 are exposed from the first insulating layer 180. The first conductive structures 190 are disposed on the corresponding first conductive pads 160. Each of the first conductive structures 190 has a first height h1. The second conductive structures 210 are disposed on the corresponding second conductive pads 170. Each of the second conductive structures 210 has a second height h2 that is greater than the first height h1. The manufacturing method of the package substrate 200 is provided in the description made to FIG. 1.

Still referring to FIG. 2A. In some embodiments, the substrate units 201 may further include a second insulating layer 230 covering the bottom surface 150b of the dielectric layer 150 or the lower surface 113 of the insulating substrate 110.

Next, the package substrate 200 is attached to an adhesive tape 240, as shown in FIG. 2B. Specifically, the package substrate 200 shown in FIG. 2A is flipped, such that the upper surface 111 of the insulating substrate 110 is faced downward and is attached to the adhesive tape 240. Therefore, all of the first conductive structures 190 and the second conductive structures 210 are covered by the adhesive tape 240. In addition, specifically, since the adhesive tape 240 is flexible, all of the first conductive structures 190 and the second conductive structures 210 may be buried in the adhesive tape 240. In various examples, the adhesive tape 240 is an UV-resistant adhesive tape, such as a blue tape.

Figure 2C:
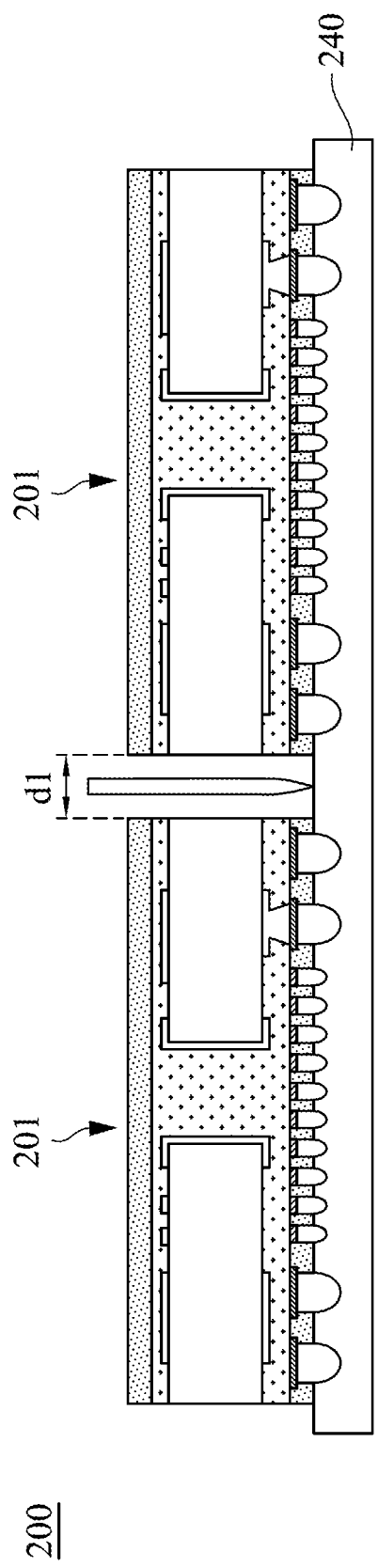

Reference is made to FIG. 2C. The package substrate 200 attached to the adhesive tape 240 is cut, such that a first gap d1 may be formed between adjacent ones of the substrate units 201. In various examples, the cutting is implemented by using a cutting wheel, laser, or waterjet. In one example, after forming a gap by using a cutting wheel and followed by stretching the adhesive tape 240 to broaden the gap, the first gap d1 with the desired width is formed. In another example, the first gap d1 with the desired width is directly formed by using a cutting wheel with a larger thickness. In some embodiments, the first gap d1 may have a width ranged from 300 um to 1000 um, such as 350 um, 400 um, 450 um, 500 um, 550 um, 600 um, 650 um, 700 um, 750 um, 800 um, 850 um, 900 um, or 950 um, but not limited thereto.

Figure 2D:
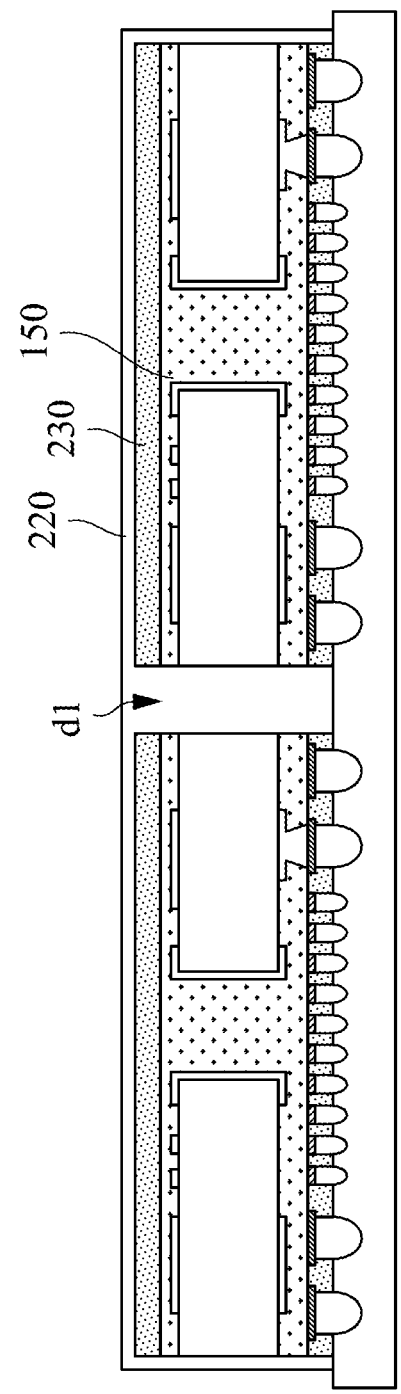

Next, referring to FIG. 2D, an encapsulation layer 220 covering each of the substrate units 201 and filling the first gap d1 is formed. In one embodiment where the second insulating layer 230 is included in the substrate units 201, the second insulating layer 230 may be disposed between the dielectric layer 150 and the encapsulation layer 220. Alternatively, the second insulating layer 230 may be disposed between the insulating substrate 110 and the encapsulation layer 220.

Figure 2E:
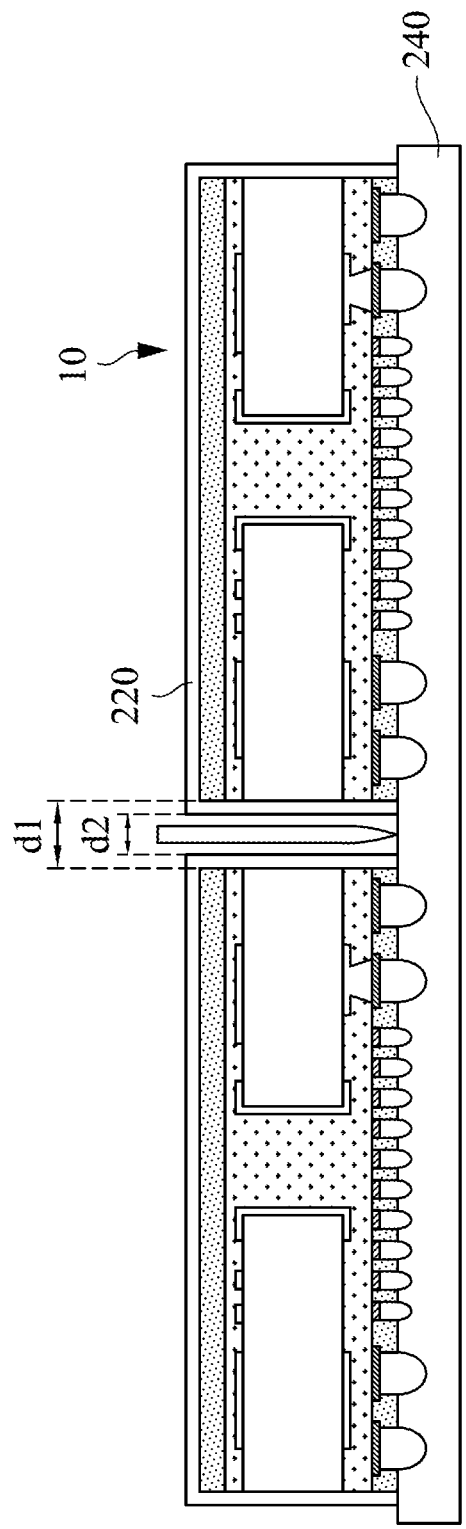

Reference is made to FIG. 2E. The encapsulation layer 220 inside the first gap d1 is cut to form a plurality of package carrier substrates 10 on the adhesive tape 240. In various examples, the cutting is implemented by using a cutting wheel, laser, or waterjet. In various embodiments, a second gap d2 is formed between adjacent ones of package carrier substrates 10 on the adhesive tape 240. The second gap d2 may have a width ranged from 100 um to 300 um, such as 110 um, 130 um, 150 um, 170 um, 190 um, 210 um, 230 um, 250 um, 270 um, or 290 um, but not limited thereto. More preferably, the first gap d1 is greater or equal to the second gap d2.

At last, the adhesive tape 240 is removed to form a plurality of package carrier substrates 10 shown in FIG. 1. In some embodiments, when the adhesive tape 240 is an UV-resistant adhesive tape such as a blue tape, the polymer chain in the UV-resistant adhesive tape can be cured by a UV light irradiation, such that the adhesiveness of the adhesive tape 240 is reduced. Thus the adhesive tape 240 can be removed conveniently and cleanly. According to one embodiment where the second insulating layer 230 is included in the substrate units 201, it is understood that the bottom surface 150b of the dielectric layer 150 or the lower surface 113 of the insulating substrate 110 are covered by the second insulating layer 230 of the package carrier substrates 10. The second insulating layer 230 may be disposed between the dielectric layer 150 and the encapsulation layer 220. Alternatively, the second insulating layer 230 may be disposed between the insulating substrate 110 and the encapsulation layer 220.

FIG. 3A to FIG. 3F illustrates schematic sectional views of a package carrier substrate 10 during various manufacturing stages according to another embodiment of the present invention.

Reference is made to FIG. 3A. First, a package substrate 300 having a plurality of substrate units 301 is provided. It is noted that the substrate units 301 shown in FIG. 3A is similar to the substrate units 201 shown in FIG. 2A. However, the difference between the substrate units 301 and the substrate units 201 is that: the substrate units 301 shown in FIG. 3A do not include the second conductive structures 210 which are disposed on the second conductive pads 170. In some embodiments, the substrate units 301 may include a second insulating layer 230 covering the bottom surface 150b of the dielectric layer 150 or the lower surface 113 of the insulating substrate 110.

Next, referring to FIG. 3B, the package substrate 300 is attached to the adhesive tape 240. Specifically, the package substrate 300 shown in FIG. 3A is flipped, such that the upper surface 111 of the insulating substrate 110 is faced downward and is attached to the adhesive tape 240. Therefore, all of the first conductive structures 190 are covered by the adhesive tape 240. In addition, specifically, since the adhesive tape 240 is flexible, therefore all of the second conductive pads 170 may be buried into the adhesive tape 240, such that the adhesive tape 240 is in contact with all of the second conductive pads 170. In various examples, the adhesive tape 240 may be an UV-resistant adhesive tape, such as a blue tape. In this example, since the adhesive tape 240 is only in contact with the first conductive structures 190 and the second conductive pads 170 without contacting the second conductive structures 210, thus the height difference is smaller, which leads to a higher adhesiveness. Therefore, a higher yield of the subsequent cutting process may be achieved.

Figure 3C:
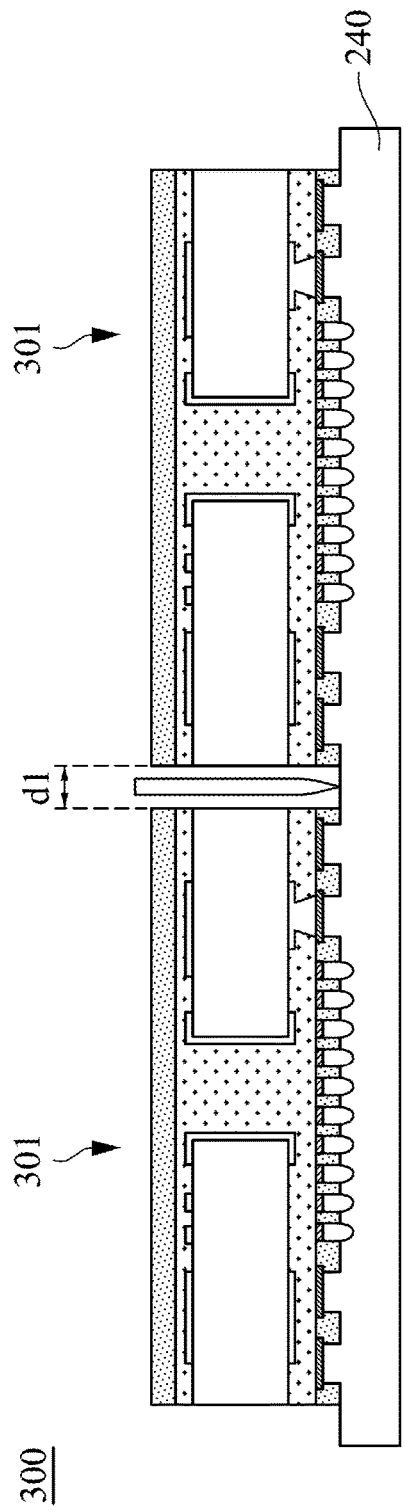

Reference is made to FIG. 3C, the package substrate 300 attached to the adhesive tape 240 is cut, such that a first gap d1 is formed between adjacent ones of the substrate units 301. In various examples, the cutting is implemented by using a cutting wheel, laser, or waterjet. In one example, after forming a gap by using cutting wheel followed by stretching the adhesive tape 240 to broaden the gap, the first gap d1 with the desired width is formed. In another example, the first gap d1 with the desired width is directly formed by using cutting wheel with a larger thickness. In some embodiments, the first gap d1 has a width ranged from 300 um to 1000 um, such as 350 um, 400 um, 450 um, 500 um, 550 um, 600 um, 650 um, 700 um, 750 um, 800 um, 850 um, 900 um, or 950 um.

Figure 3D:
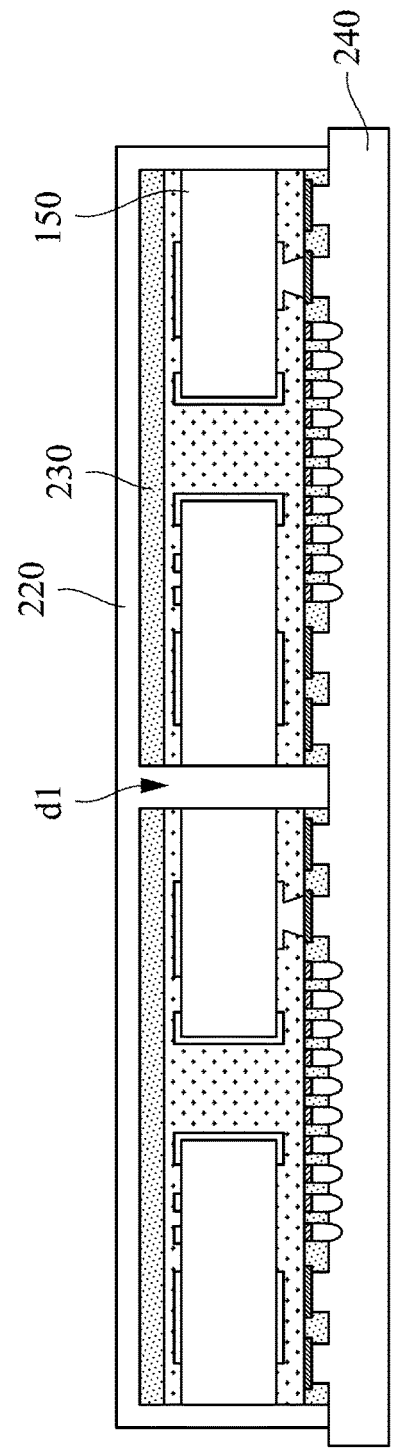

Next, referring to FIG. 3D, an encapsulation layer 220 covering each of the substrate units 301 and filling the first gap d1 is formed. In an embodiment where the second insulating layer 230 is included in the substrate units 301, the second insulating layer 230 is interposed between the dielectric layer 150 and the encapsulation layer 220. Alternatively, the second insulating layer 230 is interposed between the insulating substrate 110 and the encapsulation layer 220.

Figure 3E:
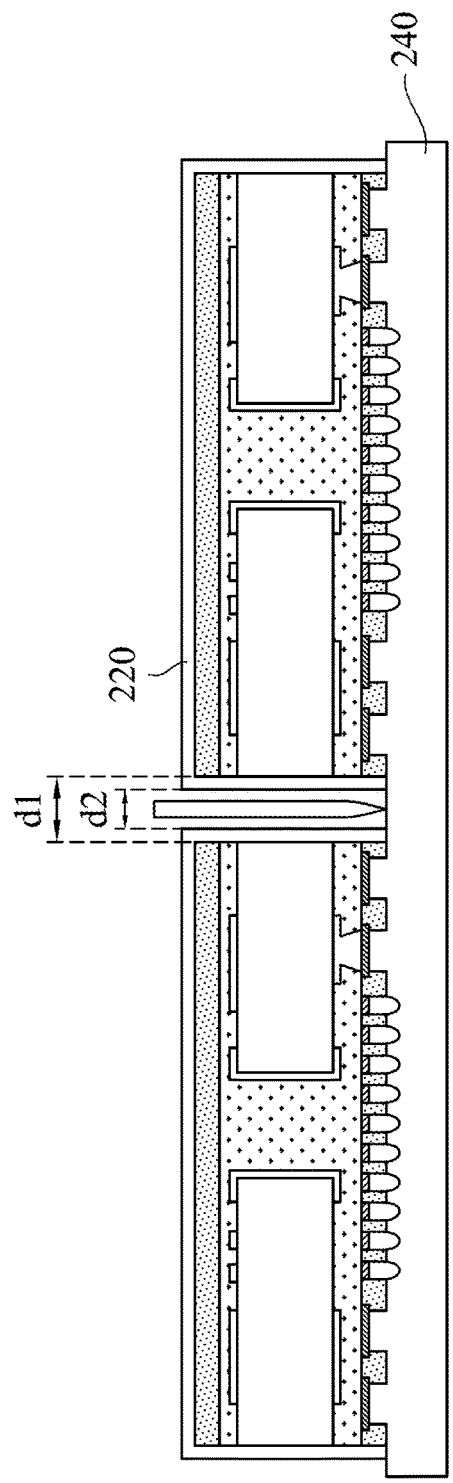

Reference is made to FIG. 3E. The encapsulation layer 220 in the first gap d1 is cut to form a second gap d2. In various examples, the cutting is implemented by using a cutting wheel, laser, or waterjet. In various embodiments, the second gap d2 formed after the cutting has a width ranged from 100 um to 300 um, such as 110 um, 130 um, 150 um, 170 um, 190 um, 210 um, 230 um, 250 um, 270 um, or 290 um. Preferably, the first gap d1 is greater or equal to the second gap d2.

Figure 3F:
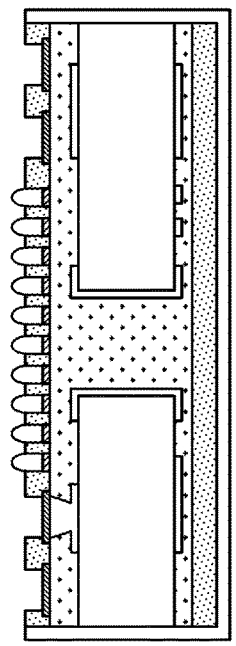

Next, the adhesive tape 240 is removed to form a plurality of structures shown in FIG. 3F. In some embodiments, when adhesive tape 240 is an UV-resistant adhesive tape such as a blue tape, the polymer chain in the UV-resistant adhesive tape can be cured by UV light irradiation, such that the adhesiveness of the adhesive tape 240 is reduced. Therefore the adhesive tape 240 may be removed conveniently and cleanly.

After the adhesive tape 240 is removed, a plurality of second conductive structures 210 is formed on the corresponding second conductive pads 170 so as to form a plurality of package carrier substrates 10 shown in FIG. 1. Specifically, each of the second conductive structures 210 has a second height h2 that is greater than the first height h1. In one embodiment where the second insulating layer 230 is included in the substrate units 301, it is understood that the bottom surface 150b of the dielectric layer 150 or the lower surface 113 of the insulating substrate 110 is covered by the second insulating layer 230 of the package carrier substrates 10. The second insulating layer 230 is interposed between the dielectric layer 150 and the encapsulation layer 220. Alternatively, the second insulating layer 230 is interposed between the insulating substrate 110 and the encapsulation layer 220.

Figure 4:
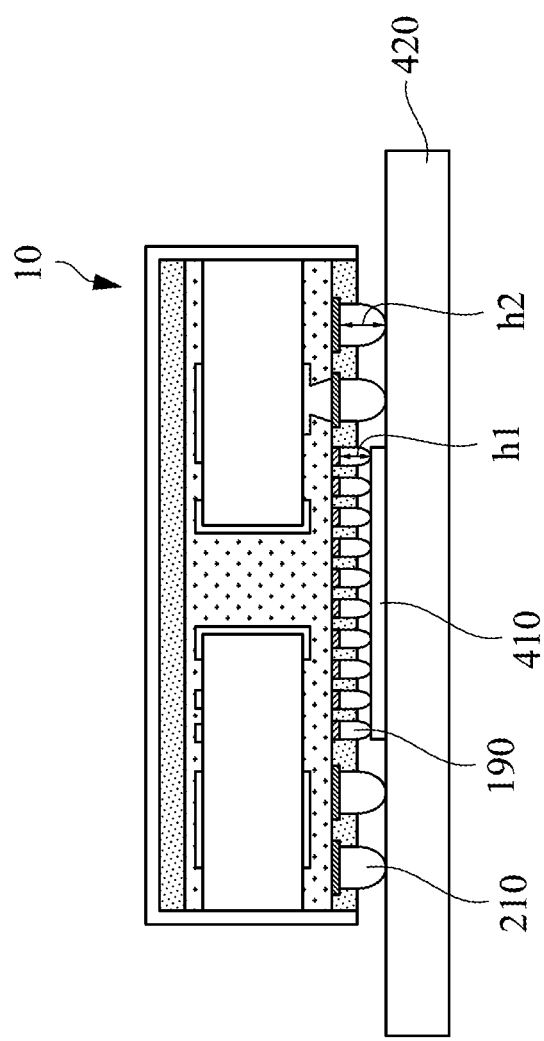
FIG. 4 illustrates a schematic sectional view of an exemplary implementation of the package carrier substrate in the present invention.

FIG. 4 illustrates a schematic sectional view of an exemplary implementation of the chip package structure 20 in the present invention. Refer to FIG. 4, in the package carrier substrate 10 shown in FIG. 1, at least one chip 410 may be soldered on the first conductive structures 190. Next, the package carrier substrate 10 is flipped and attached to a circuit board 420, such that the chip 410 is interposed between the first conductive structures 190 and the circuit board 420. Next, packaging material with high fluidity may be optionally filled between the package carrier substrate 10 and the circuit board 420. More specifically, the second conductive structures 210 of the package carrier substrate 10 are soldered onto the circuit board 420. In some embodiments, the sum of the first height h1 of the first conductive structures 190 and the thickness of the chip 410 is substantially greater than or equal to the second height h2 of the second conductive structures 210. In various examples, the chip 410 may be an active element or a chip module, an electronic component of an integrated circuit such as a digital circuit or an analog circuit, a component of DRAM, a component of SRAM, an optoelectronic device, or Micro Electro Mechanical Systems (MEMS), but not limited thereto. The chip 410 in FIG. 4 is schematic. The actual length, width, and dimension of the chip 410 may depend on the product design.

Figure 5:
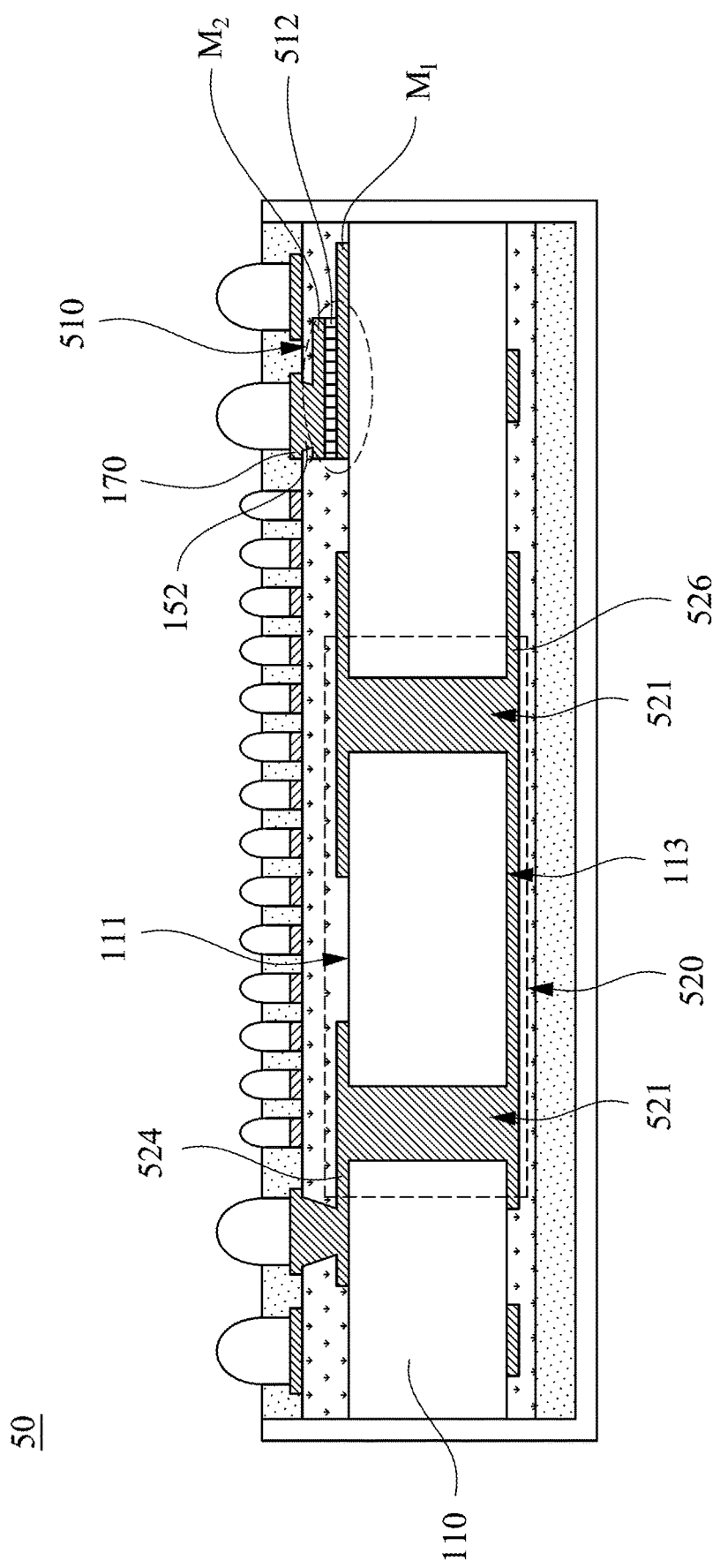
FIG. 5 illustrates a schematic sectional view of another exemplary implementation of the package carrier substrate in the present invention.
Figure 6:
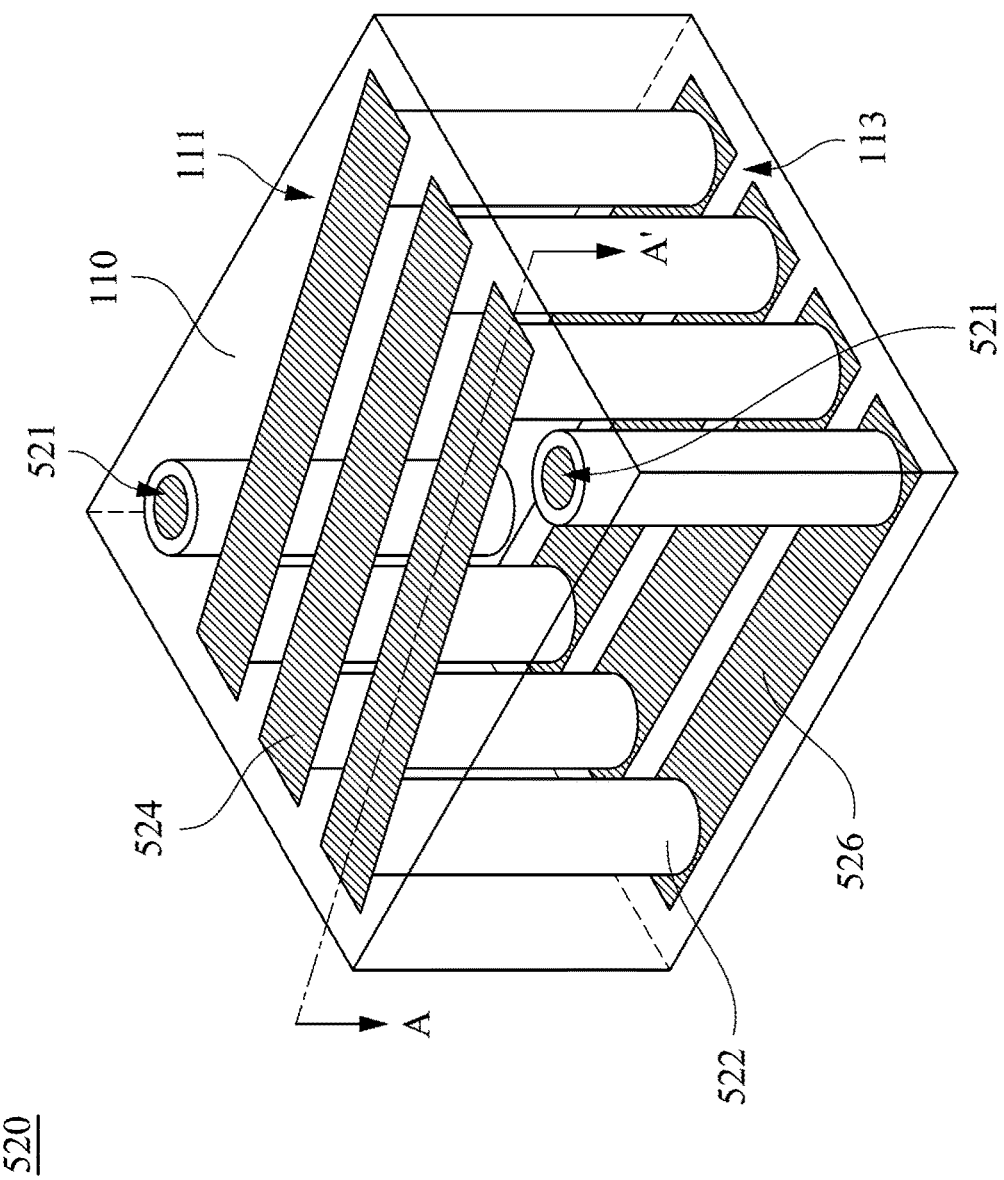
FIG. 6 illustrates a schematic three-dimensional view of an inductor in FIG. 5.

FIG. 5 illustrates a schematic sectional view of another exemplary implementation of the package carrier substrate 50 in the present invention. The package carrier substrate 50 illustrated in FIG. 5 is similar to the package carrier substrate 10 illustrated in FIG. 1. However, the package carrier substrate 50 shown in FIG. 5 may further include a capacitor 510. Specifically, the capacitor 510 is formed from a capacitor dielectric layer 512 interposed between two metal layers M1 and M2, and the capacitor 512 may be electrically coupled to the second conductive pads 170 or the first wiring layer 120 through the conductive blind holes 152. The capacitor dielectric layer 512 may be made of aluminium oxide ($Al_2O_3$), aluminium nitride (AlN), silicon oxide ($SiO_2$), silicon nitride ($Si_3N_4$), hafnium dioxide ($HfO_2$), zirconium dioxide ($ZrO_2$), lanthanum oxide ($La_2O_3$), other similar metal oxide material, metal nitride material, or other suitable high-K material. In addition, the package carrier substrate 50 may include an inductor 520. The exemplary configuration of the inductor 520 may refer to the schematic three-dimensional view of an inductor 520 in FIG. 6. Please refer to FIG. 5 and FIG. 6 simultaneously. In detail, the inductor 520 includes at least one conductive via 521, a first conductive layer 524, and a second conductive layer 526. The first conductive layer 524 may be a portion of the first wiring layer 120. Alternatively, the first conductive layer 524 and the first wiring layer 120 are the same layer or different layers. The second conductive layer 526 may be a portion of the second wiring layer 130. Alternatively, the second conductive layer 526 and the second wiring layer 130 are the same layer or different layers. The conductive via 521 penetrates through the insulating substrate 110 from the upper surface 111 to the lower surface 113. Alternatively, a magnetic thin film layer may be optionally formed and conformally covering an outer surface of the conductive via 521, a portion of the upper surface 111, and a portion of the lower surface 113. The first conductive layer 524 and the second conductive layer 526 are disposed on the upper surface 111 and the lower surface 113 respectively. The line A-A' in FIG. 6 corresponds to the sectional view of the inductor 520 shown in FIG. 5. The first conductive layer 524, the second conductive layer 526 and a plurality of the conductive vias 521 together form a three-dimensional inductor having a solenoid shape. Alternatively, a portion of the first wiring layer 120, a portion of the second wiring layer 130 and a plurality of the conductive vias 521 together form a three-dimensional inductor having a solenoid shape.

In the present invention, the first conductive structures and the second conductive structures with different heights are used in the package carrier substrate, such that the chip is covered by the insulating substrate. The tightness, reliability, and service life of the chip can be increased since the chip is disposed between the insulating substrate and the circuit board. In addition, the redistribution line can become more three-dimensional since the first wiring layer, the second wiring layer, and the conductive vias are disposed on the lower surface of the insulating substrate, such that the configuration of the first wiring layer, the second wiring layer may be designed in a more flexible and more integrated way. In this way, the size of the package carrier substrate is reduced. Moreover, the capacitor and the inductor are buried in the package carrier substrate to meet the requirements of the circuit design.

Compared to the conventional manufacturing method, the etching process of the encapsulation layer for exposing the conductive structure may be eliminated in the manufacturing method of the package carrier substrate of the present invention. Therefore the complicity of the process, the processing time and the processing costs may be reduced. Moreover, in the manufacturing method of the package carrier substrate of the present invention, various defects that are formed in the package carrier substrate during the etching process are prevented, such that the product yield is increased. In addition, the processing cost may be reduced since the capacitor and the inductor buried in the package carrier substrate can be fabricated together with the fabrication of the wiring layer and the conductive via of the insulating substrate.

Although the present invention has been described in considerable detail with reference to certain embodiments thereof, however the embodiments do not intend to limit the present invention. It will be apparent to those skilled in the art that various modifications and variations can be made to the structure of the present invention without departing from the scope or spirit of the invention. In view of the foregoing, it is intended that the present invention cover modifications and variations of this invention provided fall within the scope of the following claims.

What is claimed is:

1. A package carrier substrate, comprising:
   an insulating substrate having an upper surface and a lower surface opposite to the upper surface;
   a first wiring layer disposed on the upper surface of the insulating substrate;
   a second wiring layer disposed on the lower surface of the insulating substrate;
   at least one conductive via penetrating through the insulating substrate and electrically connected to the first wiring layer and the second wiring layer;
   a plurality of first conductive pads disposed on the upper surface of the insulating substrate and electrically connected to the first wiring layer;
   a plurality of second conductive pads disposed on the upper surface of the insulating substrate and electrically connected to the first wiring layer;
   a first insulating layer disposed on the upper surface of the insulating substrate and exposing the first conductive pads and the second conductive pads;
   a plurality of first conductive structures disposed on the first conductive pads, wherein each of the first conductive structures has a first height;
   a plurality of second conductive structures disposed on the second conductive pads, wherein each of the second conductive structures has a second height greater than the first height;
   an encapsulation layer covering the lower surface of the insulating substrate and a sidewall of the insulating substrate; and
   a second insulating layer covering the lower surface of the insulating substrate, wherein the second insulating layer is interposed between the insulating substrate and the encapsulation layer.

2. The package carrier substrate of claim 1, further comprising a dielectric layer covering the upper surface, the lower surface, the first wiring layer, and the second wiring layer.

3. The package carrier substrate of claim 2, wherein the dielectric layer comprises a plurality of conductive blind holes disposed on the first wiring layer and electrically connected to the second conductive structures.

4. The package carrier substrate of claim 1, wherein the first conductive structures and the second conductive structures are solder ball or conductive pillar.

5. The package carrier substrate of claim 1, wherein the first conductive pads are surrounded by the second conductive pads.

6. The package carrier substrate of claim 1, wherein the first height is 300 um to 600 um, whereas the second height is 60 um to 150 um.

7. The package carrier substrate of claim 1, wherein the at least one conductive via comprises a plurality of conductive vias, and the conductive vias, a portion of the first wiring layer, and a portion of the second wiring layer together form an inductor.

8. The package carrier substrate of claim 1, further comprising a capacitor disposed on the upper surface of the insulating substrate and electrically connected to the first wiring layer.

9. A manufacturing method of package carrier substrate, comprising:
providing a package substrate having a plurality of substrate units, wherein each of the substrate units comprises:
an insulating substrate having an upper surface and a lower surface opposite to the upper surface;
a first wiring layer disposed on the upper surface of the insulating substrate;
a second wiring layer disposed on the lower surface of the insulating substrate;
at least one conductive via penetrating through the insulating substrate and electrically connected to the first wiring layer and the second wiring layer;
a plurality of first conductive pads disposed on the upper surface of the insulating substrate and electrically connected to the first wiring layer;
a plurality of second conductive pads disposed on the upper surface of the insulating substrate and electrically connected to the first wiring layer;
a first insulating layer disposed on the upper surface of the insulating substrate and exposing the first conductive pads and the second conductive pads;
a plurality of first conductive structures disposed on the first conductive pads, wherein each of the first conductive structures has a first height; and
a plurality of second conductive structures disposed on the second conductive pads having a second height, wherein the second height is greater than the first height;
attaching the package substrate onto an adhesive tape, wherein the first conductive structures and the second conductive structures are completely covered by the adhesive tape;
cutting the package substrate attached to the adhesive tape, such that a first gap is formed between adjacent ones of the substrate units;
forming an encapsulation layer covering the substrate units and filling the first gaps;
cutting the encapsulation layer in the first gaps to form a plurality of package carrier substrates on the adhesive tape, such that a second gap is formed between adjacent ones of the package carrier substrates; and
removing the adhesive tape.

10. The manufacturing method of claim 9, wherein the providing of the package substrate comprises the steps of:
providing an insulating substrate having an upper surface and a lower surface opposite to the upper surface;
forming a first wiring layer, a second wiring layer, and at least one conductive via on the insulating substrate, wherein the first wiring layer and the second wiring layer are disposed on the upper surface and the lower surface of the insulating substrate respectively, whereas the at least one conductive via penetrates through the insulating substrate and electrically connected to the first wiring layer and the second wiring layer;
forming a plurality of first conductive pads and a plurality of second conductive pads on the insulating substrate, wherein the first conductive pads and the second conductive pads are disposed on the upper surface of the insulating substrate and electrically connected to the first wiring layer; and
forming a plurality of first conductive structures and a plurality of second conductive structures on the insulating substrate, wherein each of the first conductive structures is disposed on the first conductive pads and has a first height, whereas each of the second conductive structures is disposed on the second conductive pads and has a second height greater than the first height.

11. The manufacturing method of claim 9, wherein each of the first gaps has a width ranged from 300 um to 1000 um.

12. The manufacturing method of claim 9, wherein each of the second gaps has a width ranged from 100 um to 300 um.

13. The manufacturing method of claim 9, wherein each of the package carrier substrates further comprises a second insulating layer covering the lower surface of the insulating substrate, and the second insulating layer is interposed between the insulating substrate and the encapsulation layer.

14. A manufacturing method of package carrier substrate, comprising:
providing a package substrate comprising a plurality of substrate units, wherein the substrate units comprise:
an insulating substrate having an upper surface and a lower surface opposite to the upper surface;
a first wiring layer disposed on the upper surface of the insulating substrate;
a second wiring layer disposed on the lower surface of the insulating substrate;
at least one conductive via penetrating through the insulating substrate and electrically connected to the first wiring layer and the second wiring layer;
a plurality of first conductive pads disposed on the upper surface of the insulating substrate and electrically connected to the first wiring layer;
a plurality of second conductive pads disposed on the upper surface of the insulating substrate and electrically connected to the first wiring layer;
a first insulating layer disposed on the upper surface of the insulating substrate and exposing the first conductive pads and the second conductive pads; and
a plurality of first conductive structures disposed on the first conductive pads, wherein each of the first conductive structures has a first height;
attaching the package substrate onto an adhesive tape, wherein the first conductive structures is completely covered by the adhesive tape;

cutting the package substrate attached to the adhesive tape, such that a first gap is formed between adjacent ones of the substrate units;

forming an encapsulation layer covering the substrate units and filling the first gaps;

cutting the encapsulation layer on the first gaps to form a plurality of second gaps;

removing the adhesive tape; and after the removing of the adhesive tape, forming a plurality of second conductive structures on the second conductive pads to form a plurality of package carrier substrates, wherein each of the second conductive structures has a second height greater than the first height.

15. The manufacturing method of claim 14, wherein the providing of the package substrate comprises steps of:

providing an insulating substrate having an upper surface and a lower surface opposite to the upper surface;

forming a first wiring layer, a second wiring layer, and at least one conductive via on the insulating substrate, wherein the first wiring layer and the second wiring layer are disposed on the upper surface and the lower surface of the insulating substrate respectively, whereas the at least one conductive via penetrates through the insulating substrate and electrically connected to the first wiring layer and the second wiring layer;

forming a plurality of first conductive pads and a plurality of second conductive pads on the insulating substrate, wherein the first conductive pads and the second conductive pads are disposed on the upper surface of the insulating substrate and electrically connected to the first wiring layer; and forming a plurality of first conductive structures on the insulating substrate, wherein each of the first conductive structures is disposed on the first conductive pads and has a first height.

16. The manufacturing method of claim 14, wherein each of the first gaps has a width ranged from 300 um to 1000 um.

17. The manufacturing method of claim 14, wherein each of the second gaps has a width ranged from 100 um to 300 um.

18. The manufacturing method of claim 14, wherein the package carrier substrates further comprising a second insulating layer covering the lower surface of the insulating substrate, and the second insulating layer is interposed between the insulating substrate and the encapsulation layer.

* * * * *